(12) United States Patent
Li et al.

(10) Patent No.: US 12,464,921 B2
(45) Date of Patent: Nov. 4, 2025

(54) DISPLAY PANEL AND DISPLAY APPARATUS (71) Applicant: SEEYA OPTRONICS CO., LTD., Shanghai (CN)

(72) Inventors: Jialing Li, Shanghai (CN); Liyuan Luo, Shanghai (CN); Yongcai Shen, Shanghai (CN); Run Yang, Shanghai (CN)

(73) Assignee: SEEYA OPTRONICS CO., LTD., Shanghai (CN)

( * ) Notice: Subject to any disclaimer, the term of this patent is extended or adjusted under 35 U.S.C. 154(b) by 390 days.

(21) Appl. No.: 18/212,932

(22) Filed: Jun. 22, 2023

(65) Prior Publication Data
US 2024/0215369 A1 Jun. 27, 2024

(30) Foreign Application Priority Data

Dec. 27, 2022 (CN) .......................... 202211688044.9

(51) Int. Cl.
*H10K 59/35* (2023.01)
*H10K 59/122* (2023.01)
*H10K 59/80* (2023.01)

(52) U.S. Cl.
CPC ......... *H10K 59/353* (2023.02); *H10K 59/122* (2023.02); *H10K 59/879* (2023.02)

(58) Field of Classification Search
CPC ... H10K 59/353; H10K 59/122; H10K 59/879
See application file for complete search history.

(56) References Cited

U.S. PATENT DOCUMENTS

| 2009/0195144 A1* | 8/2009 | Kitabayashi | ......... | H10K 50/805 |
| | | | | 313/503 |
| 2013/0038513 A1* | 2/2013 | Park | ..................... | H10K 59/353 |
| | | | | 345/55 |

FOREIGN PATENT DOCUMENTS

CN 206076238 U * 4/2017

* cited by examiner

*Primary Examiner* — Mariceli Santiago
(74) *Attorney, Agent, or Firm* — Michael Best & Friedrich LLP (57) ABSTRACT

A display panel includes a display region, a substrate, and multiple sub-pixels. The multiple sub-pixels are located in the display region on one side of the substrate. The multiple sub-pixels are arranged in rows along a first direction. Two adjacent rows of sub-pixels are staggered. The multiple sub-pixels include first sub-pixels and second sub-pixels located in the two adjacent rows. The coordinates of the center of a first sub-pixel are denoted as (0, 0). The coordinates of the center of a second sub-pixel are denoted as $(x_1, y_1)$. A sub-pixel includes a first electrode. In the direction perpendicular to the substrate, the first electrode is polygonal and includes a first electrode side and a second electrode side connected in sequence. The included angle between the first electrode side and the first direction and the included angle between the second electrode side and the first direction are each $\theta$.

20 Claims, 10 Drawing Sheets

ND DISPLAY APPARATUS

DISPLAY PANEL AND DISPLAY APPARATUS

CROSS-REFERENCE TO RELATED APPLICATION

This application claims priority to Chinese Patent Application No. 202211688044.9, filed on Dec. 27, 2022, the disclosure of which is incorporated herein by reference in its entirety.

TECHNICAL FIELD

The present disclosure relates to the field of display technology and, in particular, to a display panel and a display apparatus.

BACKGROUND

With the development of science and technology and the progress of the society, people are increasingly dependent on information exchange and transfer. As the main medium and material basis for information exchange and transfer, a display apparatus has become a focus of research for many scientists.

According to the design of an existing honeycomb-shaped pixel, the shape of an anode and the shape of a pixel opening are hexagon with a certain symmetry. The included angle of a hexagon is 120 degrees. When a display panel is provided with a microlens, a virtual image is formed due to the modulation of the microlens, resulting in poor viewing.

SUMMARY

The present disclosure provides a display panel and a display apparatus to improve display viewing.

In a first aspect, an embodiment of the present disclosure provides a display panel. The display panel includes a display region, a substrate; and a plurality of sub-pixels.

The plurality of sub-pixels are located in the display region on one side of the substrate. The plurality of sub-pixels are arranged in rows along a first direction. Two adjacent rows of sub-pixels are staggered. The sub-pixels include first sub-pixels and second sub-pixels located in the two adjacent rows. The coordinates of the center of a first sub-pixel are denoted as (0, 0). The coordinates of the center of a second sub-pixel are denoted as $(x_1, y_1)$.

A sub-pixel includes a first electrode. In the direction perpendicular to the substrate, the first electrode is polygonal and includes a first electrode side and a second electrode side connected in sequence. The included angle between the first electrode side and the first direction and the included angle between the second electrode side and the first direction are each θ.

The length of the horizontal axis of the circumscribed ellipse of the polygonal edge of the first electrode along the first direction is denoted as a. The length of the vertical axis of the circumscribed ellipse along a second direction is denoted as b. The second direction is perpendicular to the first direction.

The circumscribed ellipse of the first sub-pixel is tangent to the circumscribed ellipse of the second sub-pixel.

θ satisfies $\theta = \arctan\left(\left|-\frac{b^2 x_1}{a^2 y_1}\right|\right)$.

In a second aspect, an embodiment of the present disclosure provides a display apparatus. The display apparatus includes the display panel described in the first aspect.

According to the display panel provided in embodiments of the present disclosure, the extension directions of the first electrode side and the second electrode side of the first electrode in a sub-pixel are determined according to a tangent of the circumscribed ellipse. The included angle θ between the first electrode side and the first direction and the included angle θ between the second electrode side and the first direction satisfy $$\theta = \arctan\left(\left|-\frac{b^2 x_1}{a^2 y_1}\right|\right).$$

The included angle formed between the first electrode side and the second electrode side is no longer fixed at 120 degrees. The included angle formed between the first electrode side and the second electrode side is defined by the shape of the circumscribed ellipse of the sub-pixel. The aspect ratio of the sub-pixel is close to the ratio of the length of the horizontal axis of the circumscribed ellipse to the length of the vertical axis of the circumscribed ellipse. The first direction is the length direction. The second direction is the width direction. Thus, the display viewing is improved.

DETAILED DESCRIPTION

The present disclosure is further described hereinafter in detail in conjunction with drawings and embodiments. It is to be understood that the embodiments described herein are intended to explain the present disclosure and not to limit the present disclosure. Additionally, it is to be noted that for ease of description, only part, not all, of the structures related to the present disclosure are illustrated in the drawings.

When a display panel is provided with a microlens, a virtual image is formed due to the modulation of the microlens. The virtual image contains an intermediate light spot and an edge color polarized halo. The virtual image is related to the shape of a pixel opening. When the difference between the shape of the pixel opening and the shape of a display region is large, the virtual image and the display region overlap insufficiently, so that the edge of the virtual image is obviously visible, resulting in poor viewing.

When the difference between the shape of the pixel opening and the shape of the display region is small, for example, the aspect ratio of the pixel opening is close to the aspect ratio of the display region, the display region and the virtual image overlap more, so that the proportion of the edge color polarized halo in the virtual image is smaller, and the edge is blurred, thereby improving the virtual image problem.

It is to be noted that the difference between the shape of the pixel opening and the shape of the display region does not refer to the difference between the geometry shape of the pixel opening and the geometry shape of the display region, but to the difference between the overall shape of multiple pixel openings after final imaging and the shape of the display region. For a rectangular display region, if the shape of a pixel opening on a hexagonal anode is rectangular, the pixel opening is too small, so that the formed virtual image light spot cannot fill the display region and a large range of the light spot edge region exists. As a result, the rectangular pixel opening has a more obvious virtual image edge and poorer viewing than a hexagonal pixel opening.

Figure 1:
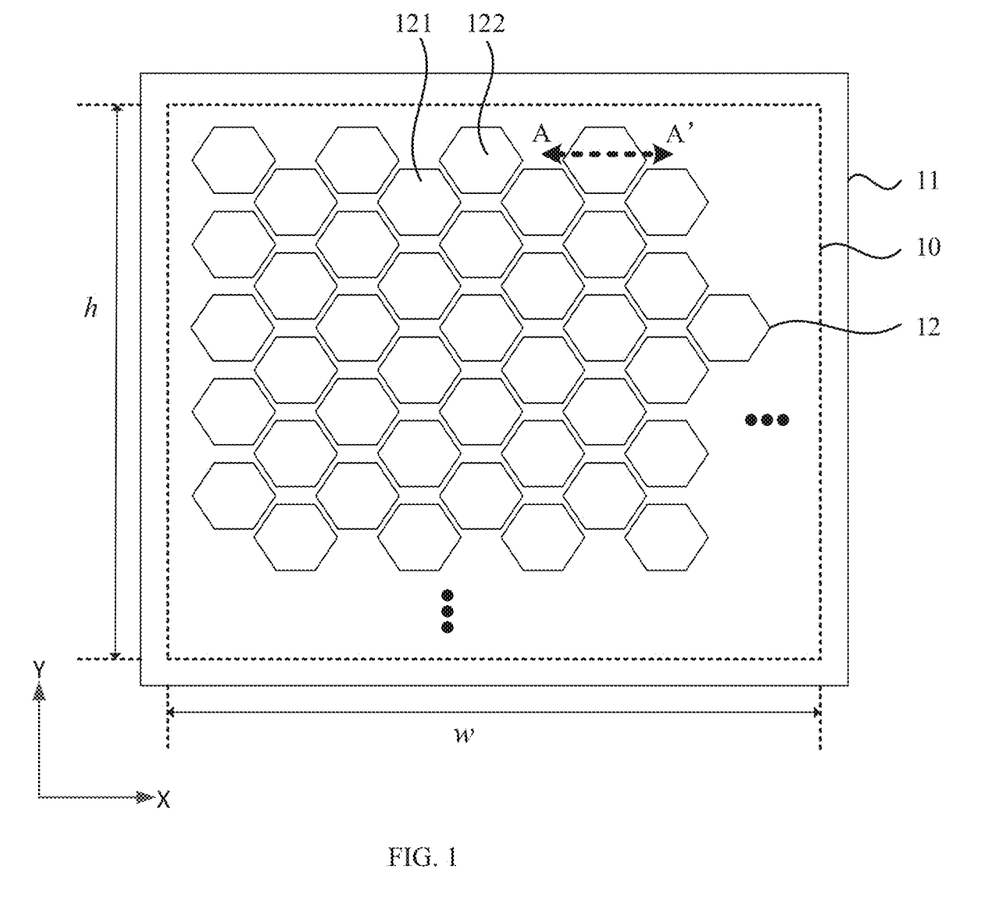
FIG. 1 is a top view of a display panel according to an embodiment of the present disclosure.
Figure 2:
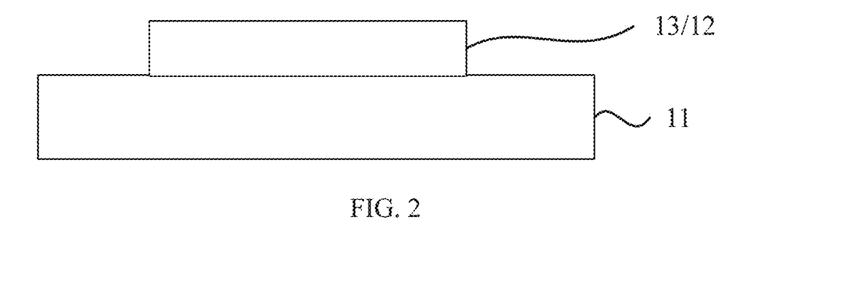
FIG. 2 is a sectional view taken along the AA' direction in FIG. 1.
Figure 3:
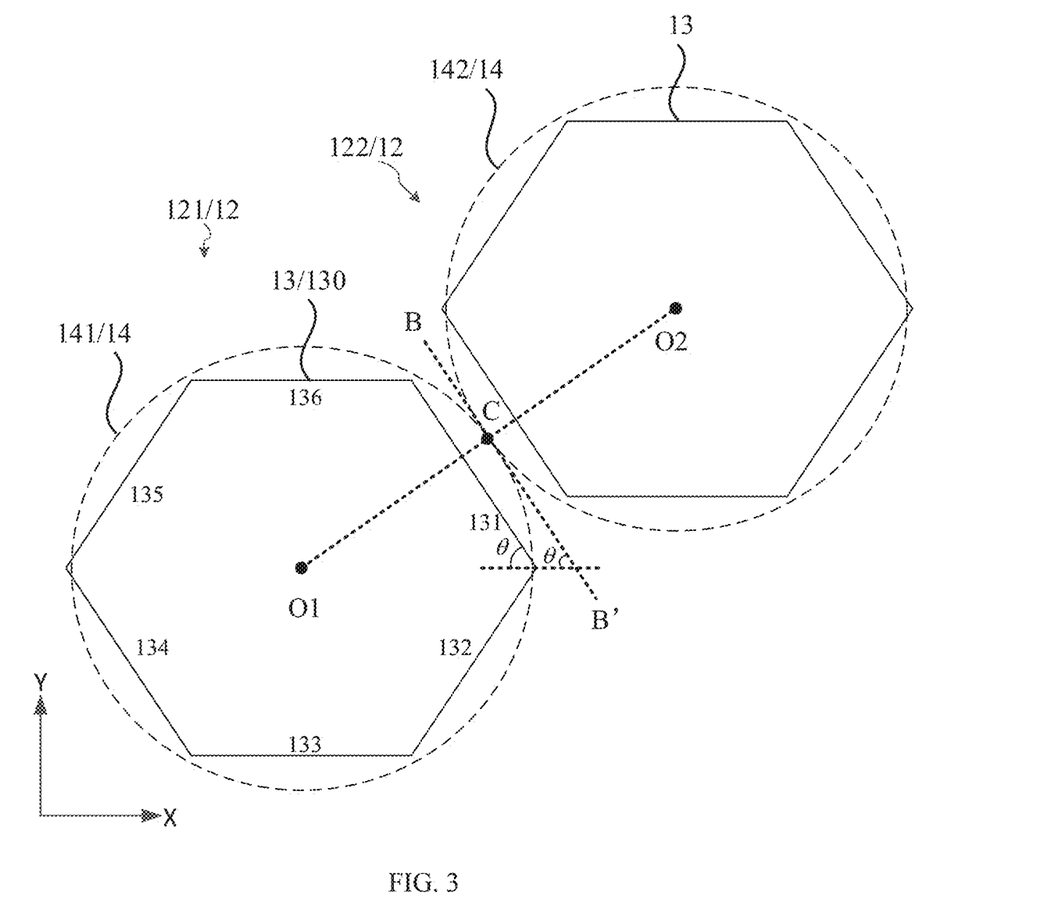
FIG. 3 is a top view of a first sub-pixel and a second sub-pixel adjacent to each other according to an embodiment of the present disclosure.
Figure 4:
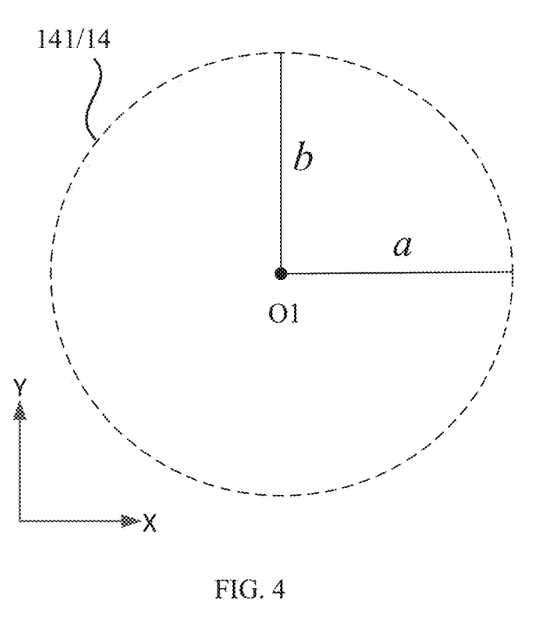
FIG. 4 is a top view of the circumscribed ellipse of the polygonal edge of a first electrode in FIG. 3.

FIG. 1 is a top view of a display panel according to an embodiment of the present disclosure. FIG. 2 is a sectional view taken along the AA' direction in FIG. 1. FIG. 3 is a top view of a first sub-pixel and a second sub-pixel adjacent to each other according to an embodiment of the present disclosure. FIG. 4 is a top view of the circumscribed ellipse of the polygonal edge of a first electrode in FIG. 3. With reference to FIGS. 1 to 4, the display panel includes a display region 10. In an embodiment, the display panel may include merely the display region 10 so that a full screen display is realized. In another embodiment, the display panel may also include a non-display region. The display region 10 is a region where an image is displayed. The non-display region is a region where no image is displayed.

The display panel includes a substrate 11 and multiple sub-pixels 12. The multiple sub-pixels 12 are located in the display region 10 on one side of the substrate 11. The multiple sub-pixels 12 are arranged in rows along a first direction X. Two adjacent rows of sub-pixels 12 are staggered. A sub-pixel 12 overlaps the gap between two sub-pixels 12 in an adjacent row. The multiple sub-pixels 12 include a first sub-pixel 121 and a second sub-pixel 122 located in the two adjacent rows. The first sub-pixel 121 is adjacent to the second sub-pixel 122. The coordinates of the center O1 of the first sub-pixel 121 are denoted as (0, 0). The coordinates of the center O2 of the second sub-pixel 122 are denoted as $(x_1, y_1)$.

A sub-pixel 12 includes a first electrode 13. In the direction perpendicular to the substrate 11, the first electrode 13 is polygonal. The first electrode 13 includes a first electrode side 131 and a second electrode side 132 connected in sequence. The included angle between the first electrode side 131 and the first direction and the included angle between the second electrode side 132 and the first direction are each $\theta$. The included angle between the first electrode side 131 and the second electrode side 132 is $2\theta$.

The length of the horizontal axis of the circumscribed ellipse 14 of the polygonal edge of the first electrode 13 along the first direction X is denoted as a. The length of the vertical axis of the circumscribed ellipse 14 along a second direction Y is denoted as b. The second direction Y is perpendicular to the first direction X. The circumscribed ellipse 14 may be located on the periphery of the first electrode 13, that is, the circumscribed ellipse 14 may be externally connected to the first electrode 13. Alternatively, the circumscribed ellipse 14 may overlap the edge of the first electrode 13. The center of the circumscribed ellipse 14 may coincide with the center of the first electrode 13. It is to be noted that a circle is a special case of an ellipse. The ellipse in each embodiment of the present disclosure is an ellipse in a broad sense, including a circle.

The circumscribed ellipse 14 of the first sub-pixel 121 is denoted as a first circumscribed ellipse 141. The circumscribed ellipse 14 of the second sub-pixel 122 is denoted as a second circumscribed ellipse 142. The first circumscribed ellipse 141 is tangent to the second circumscribed ellipse 142 at point C.

Each sub-pixel 12 has the same size and shape. The circumscribed ellipse 14 of each sub-pixel 12 has the same size and shape. The first sub-pixel 121 and the second sub-pixel 122 have the same size and shape. The first circumscribed ellipse 141 and the second circumscribed ellipse 142 have the same size and shape. Point C is the midpoint of a line segment O1-O2. The coordinates of point C are denoted as $$\left(\frac{x_1}{2}, \frac{y_1}{2}\right).$$

The ellipse equation satisfied by the first circumscribed ellipse 141 is:

$$\frac{x^2}{a^2} + \frac{y^2}{b^2} = 1. \tag{1}$$

Point C is located on the first circumscribed ellipse 141. A straight line BB' passing through the first circumscribed ellipse 141 of point C is the tangent of the first circumscribed ellipse 141 at point C. The slope k of the straight line BB' satisfies:

$$k = -\frac{b^2 \cdot \frac{x_1}{2}}{a^2 \cdot \frac{y_1}{2}} = -\frac{b^2 \cdot x_1}{a^2 \cdot y_1}. \tag{2}$$

Thus, the extension direction of the first electrode side 131 is set according to the extension direction of the straight line BB'. The extension direction of the first electrode side 131 is parallel to the extension direction of the straight line BB'. Thus, $\theta$ satisfies $$\theta = \arctan\left(\left|-\frac{b^2 x_1}{a^2 y_1}\right|\right). \tag{3}$$

According to the display panel provided in this embodiment of the present disclosure, the extension directions of the first electrode side 131 and the second electrode side 132 of the first electrode 13 in a sub-pixel 12 are determined according to the tangent of the circumscribed ellipse 14. The included angle θ between the first electrode side 131 and the first direction X and the included angle θ between the second electrode side 132 and the first direction X satisfy $$\theta = \arctan\left(\left|-\frac{b^2 x_1}{a^2 y_1}\right|\right).$$

The included angle formed between the first electrode side 131 and the second electrode side 132 is no longer fixed at 120 degrees. The included angle formed between the first electrode side 131 and the second electrode side 132 is defined by the shape of the circumscribed ellipse 14 of the sub-pixel 12. The aspect ratio of the sub-pixel 12 is close to the ratio of the length of the horizontal axis of the circumscribed ellipse 14 to the length of the vertical axis of the circumscribed ellipse 14. The first direction X is the length direction. The second direction Y is the width direction. In this manner, the display viewing is improved.

Further, it is to be noted that when the included angle $$\theta \text{ satisfies } \theta = \arctan\left(\left|-\frac{b^2 x_1}{a^2 y_1}\right|\right),$$

the pixel opening provided corresponding to the first electrode 13 may include two typical shapes. The shape of a pixel opening is a polygon. The shape of the pixel opening is similar to the shape of the first electrode 13. Thus, the pixel opening can have a maximum aperture ratio. The shape of another pixel opening is an ellipse (including a circle). Thus, the virtual image problem can be better improved. Therefore, in the display panel provided in this embodiment of the present disclosure, the first electrode 13 may be matched with two different types of pixel openings. Therefore, when a display panel with two different types of pixel openings is manufactured, only the same mask plate of the first electrode 13 is required.

It is to be understood that more than two types of pixel openings may be provided for matching with the first electrode 13 by changing the shape of pixel openings, for example, proportionally reducing the shape of the preceding two types of pixel openings, or providing any other shape different from the preceding two types of pixel openings.

Optionally, with reference to FIGS. 1 to 4, the first electrode 13 is hexagonal. The first electrode 13 also includes a third electrode side 133, a fourth electrode side 134, a fifth electrode side 135, and a sixth electrode side 136 connected in sequence. The third electrode side 133 is connected to the second electrode side 132 and the fourth electrode side 134. The sixth electrode edge 136 is connected to the fifth electrode side 135 and the first electrode side 131. The third electrode side 133 and the sixth electrode side 136 each extend along the first direction X. The first electrode side 131 is parallel to the fourth electrode side 134. The second electrode side 132 is parallel to the fifth electrode side 135.

Exemplarily, the apex angle of the hexagonal shape of the first electrode 13 is no longer fixed at 120 degrees. θ is greater than 60 degrees. The included angle formed between the first electrode side 131 and the second electrode side 132 is greater than 120 degrees. In other embodiments, θ may be less than 60 degrees. The included angle formed between the first electrode side 131 and the second electrode side 132 is less than 120 degrees.

Exemplarily, the shape of the first electrode 13 is not limited to a hexagon, and may be, for example, a heptagon or an octagon. For ease of understanding, one apex angle of the first electrode 13 in the shape of a hexagon as shown in FIG. 3 may be cut off to form a heptagon. The heptagon formed after cutting off the apex angle may have the same center as the hexagon before cutting off the apex angle. Therefore, it is to be understood that the center of the sub-pixel 12 is used as the center of the first electrode 13, or the center of the circumscribed ellipse 14 is used as the center of the first electrode 13.

Optionally, with reference to FIGS. 1 to 4, the width of the display region 10 along the first direction X is denoted as w. The height of the display region 10 along the second direction Y is denoted as h. When $$a > b, \frac{1.5\,w}{h} > \frac{a}{b} > \frac{0.5\,w}{h}. \qquad (4)$$

When $$a < b, \frac{1.5\,h}{w} > \frac{b}{a} > \frac{0.5\,h}{w}. \qquad (5)$$

When the length a of the horizontal axis and the length b of the vertical axis of the circumscribed ellipse 14 of the polygonal edge of the first electrode 13 satisfy the preceding equation (4) and equation (5), the length a of the horizontal axis and the length b of the vertical axis of the circumscribed ellipse 14 can be correspondingly set according to the determined width w and height h of the display region 10. Thus, the included angle θ and the shape of the first electrode 13 can be further determined. Thus, when the microlens is provided, the display region 10 and the virtual image overlap more, thereby improving the virtual image problem.

Figure 5:
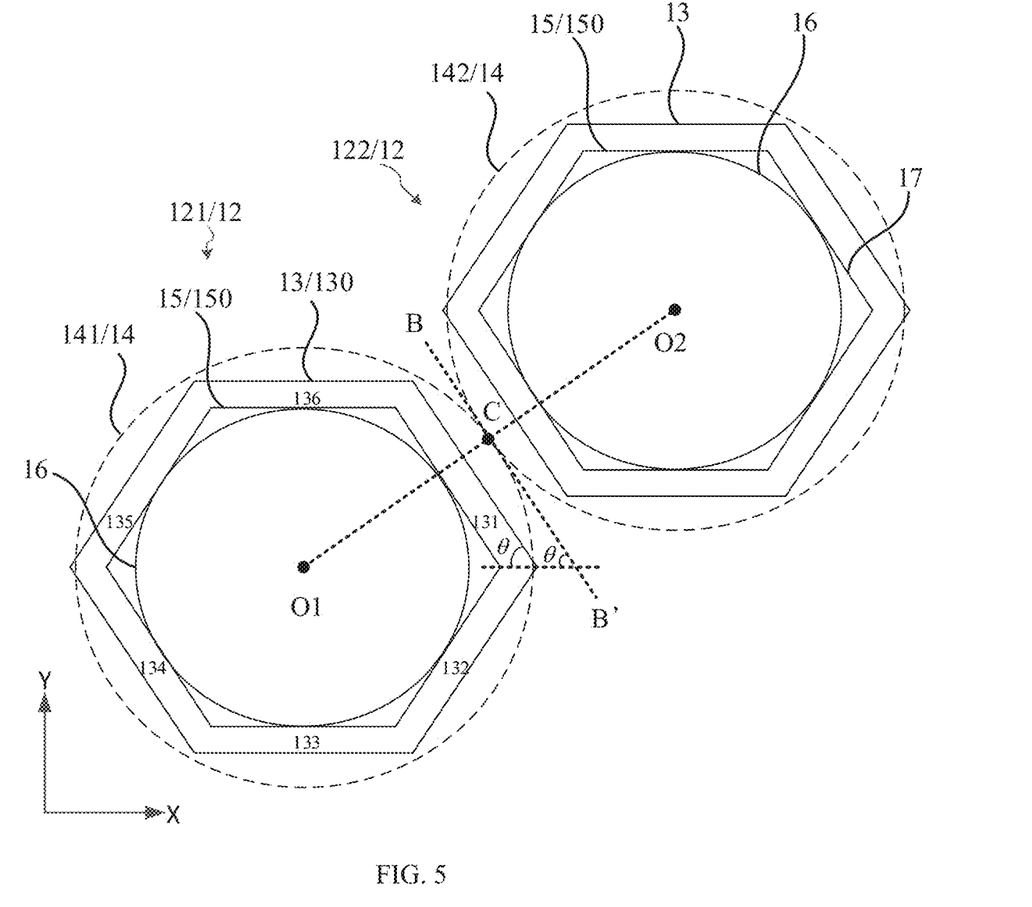
FIG. 5 is another top view of a first sub-pixel and a second sub-pixel adjacent to each other according to an embodiment of the present disclosure.
Figure 6:
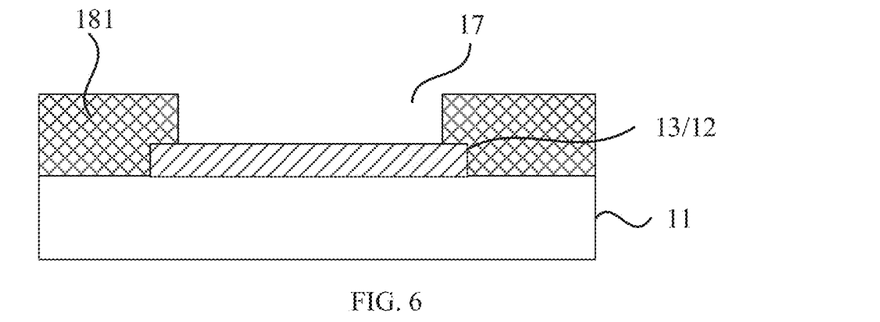
FIG. 6 is another sectional view taken along the AA' direction in FIG. 1.

FIG. 5 is another top view of a first sub-pixel and a second sub-pixel adjacent to each other according to an embodiment of the present disclosure. FIG. 6 is another sectional view taken along the AA' direction in FIG. 1. Referring to FIGS. 1, 5, and 6, the polygon formed by the first electrode 13 includes a virtual polygon 15. Each virtual side 150 of the virtual polygon 15 is parallel to each electrode side 130 of the polygon formed by the first electrode 13 in a one-to-one manner. The number of virtual sides 150 of the virtual polygon 15 is equal to the number of electrode sides 130 of the first electrode 13.

The length of the horizontal axis of a virtual ellipse 16 in the polygon formed by the first electrode 13 along the first direction X is a·j, and the length of the vertical axis of the virtual ellipse 16 along the second direction Y is b·j, where 0<j<1. The virtual ellipse 16 is the shape of the circumscribed ellipse 14 after scaling down, or in other words, the circumscribed ellipse 14 is the shape of the virtual ellipse 16 after scaling up. The virtual ellipse 16 is located in the virtual polygon 15. The virtual ellipse 16 is tangent to multiple virtual sides 150. In an embodiment, the virtual ellipse 16 is tangent to part of virtual sides 150 in the virtual polygon 15. In another embodiment, the virtual ellipse 16 is tangent to all of virtual sides 150 in the virtual polygon 15.

The display panel also includes a pixel opening 17. The vertical projection of the pixel opening 17 in the substrate 11 is located in the virtual polygon 15. Since it is necessary to reserve a certain boundary value for process fluctuations, the virtual polygon 15 is located in the polygon formed by the first electrode 13. Similarly, the pixel opening 17 cannot exceed the range in which the virtual polygon 15 is located in consideration of process fluctuations in the manufacturing process of the display panel.

Optionally, with reference to FIG. 5, the pixel opening 17 coincides with the virtual polygon 15. That is, the pixel opening 17 is set according to the range and position in which the virtual polygon 15 is located. The pixel opening 17 has a shape similar to that of the first electrode 13. The pixel opening 17 has a maximum aperture ratio.

Optionally, with reference to FIG. 6, the display panel also includes a pixel defining layer 181. The pixel defining layer 181 is located on the side of the first electrode 13 facing away from the substrate 11. The pixel defining layer 181 is provided with multiple pixel openings 17 (one pixel opening 17 is shown in FIG. 6). The pixel opening 17 is the opening in the pixel defining layer 181. In other embodiments, the display panel may also not include the pixel defining layer 181. The pixel opening 17 is defined by, such as, the opening of a black matrix.

Figure 7:
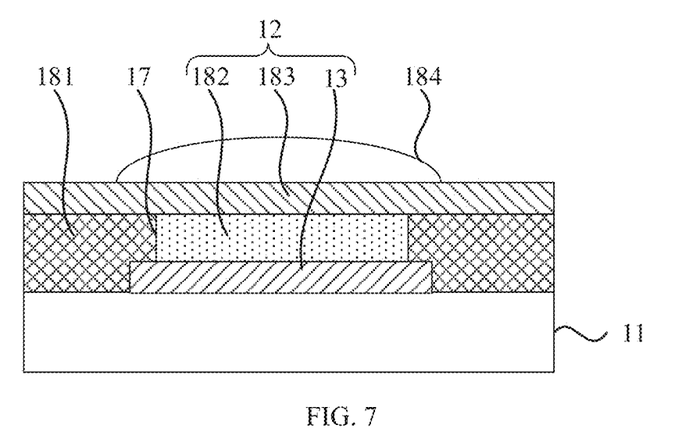
FIG. 7 is another sectional view taken along the AA' direction in FIG. 1.
Figure 8:
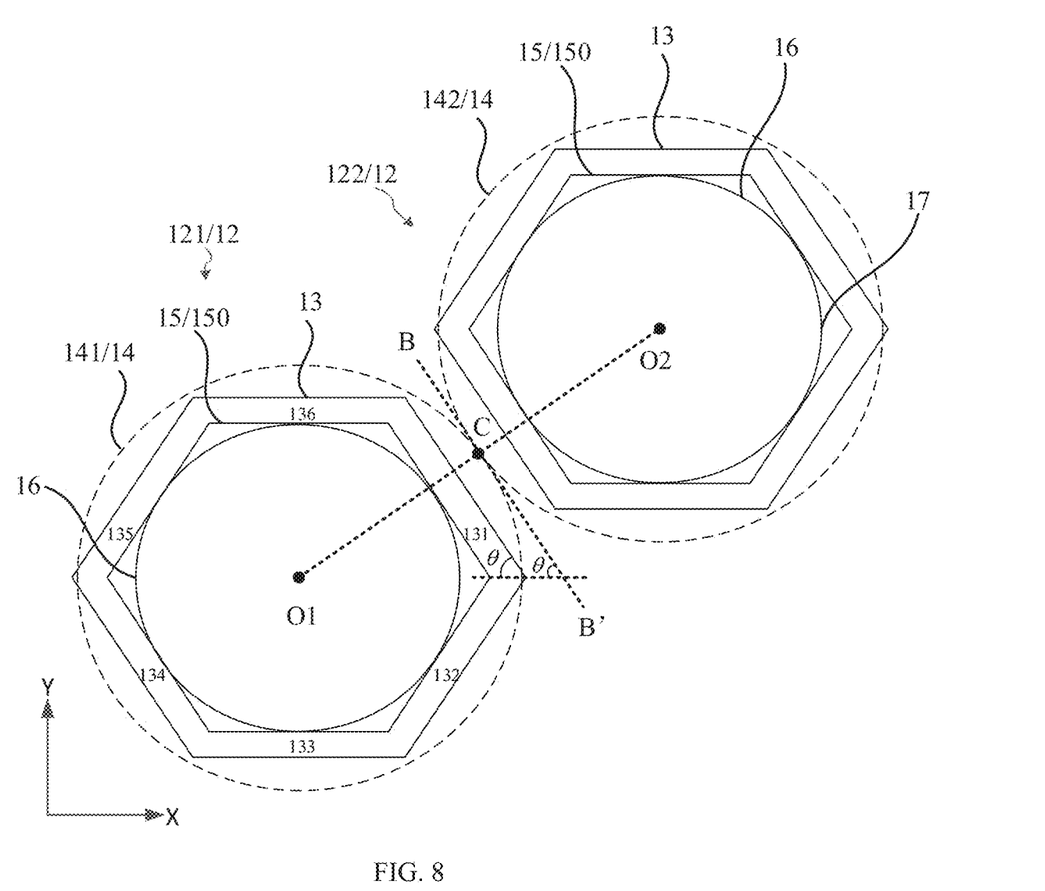
FIG. 8 is another top view of a first sub-pixel and a second sub-pixel adjacent to each other according to an embodiment of the present disclosure.

FIG. 7 is another sectional view taken along the AA' direction in FIG. 1. FIG. 8 is another top view of a first sub-pixel and a second sub-pixel adjacent to each other according to an embodiment of the present disclosure. With reference to FIGS. 1, 7, and 8, the display panel also includes a microlens 184. The microlens 184 is located on the side of the sub-pixel 12 facing away from the substrate 11. In the direction perpendicular to the substrate 11, the microlens 184 overlaps the virtual ellipse 16. That is, the microlens 184 overlaps the region in which the virtual ellipse 16 is located. By providing the microlens 184 in the display panel, the microlens 184 has a converging effect on light rays passing through the microlens 184, thereby implementing an effect such as improving the brightness.

Exemplarily, with reference to FIG. 7 and FIG. 8, in the direction perpendicular to the substrate 11, the microlens 184 overlaps the virtual polygon 15, the microlens 184 overlaps the first electrode 13, and the microlens 184 overlaps the sub-pixel 12.

Optionally, with reference to FIG. 8, the pixel opening 17 coincides with the virtual ellipse 16. That is, the pixel opening 17 is set according to the range and position in which the virtual ellipse 16 is located. The difference between the shape of the pixel opening 17 and the shape of the display region 10 is small, the display region 10 and the virtual image generated by the microlens 184 overlap more, and thus the proportion of the edge color polarized halo in the virtual image is small, thereby improving the virtual image problem. On the other hand, the virtual ellipse 16 is tangent to multiple virtual sides 150. The aperture ratio of the virtual ellipse 16 is relatively large, thereby facilitating the improvement of the aperture ratio. In other words, when the pixel opening 17 coincides with the virtual ellipse 16, the display panel can have the maximum aperture ratio on the premise of ensuring the improvement of the virtual image problem.

According to this embodiment of the present disclosure, the virtual image problem can be improved to the maximum extent, and the aperture ratio can be improved to the maximum extent.

Figure 9:
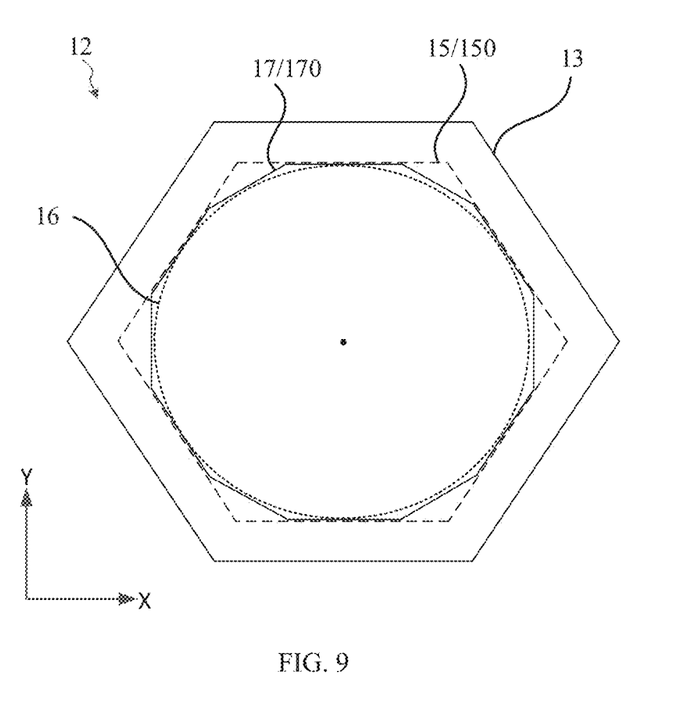
FIG. 9 is a top view of another sub-pixel according to an embodiment of the present disclosure.

FIG. 9 is a top view of another sub-pixel according to an embodiment of the present disclosure. For clarity, a virtual polygon 15 and a virtual ellipse 16 are illustrated by dashed lines. A pixel opening 17 is illustrated by solid lines. Referring to FIG. 7 and FIG. 9, the virtual ellipse 16 is located in the vertical projection of the pixel opening 17 in the substrate 11. The vertical projection of the pixel opening 17 in the substrate 11 is located in the virtual polygon 15. The edge of the vertical projection of the pixel opening 17 in the substrate 11 is located between the edge of the virtual ellipse 16 and the edge of the virtual polygon 15. In this embodiment, the virtual ellipse 16 is located in the vertical projection of the pixel opening 17 in the substrate 11. The area of the pixel opening 17 is greater than the area of the virtual ellipse 16, thereby having a larger aperture ratio.

Optionally, referring to FIG. 9, the pixel opening 17 includes multiple opening sides 170 connected in sequence. The number of opening sides 170 is greater than the number of virtual sides 150. It is to be understood that an ellipse can be seen as the shape of a polygon when the number of sides of the polygon approaches infinity. The more the number of opening sides 170 is, the closer the pixel opening 17 is to the ellipse that best improves the virtual image problem. In this embodiment of the present disclosure, the number of opening sides 170 is set to be greater than the number of virtual sides 150 to improve the virtual image problem when the display panel sets the microlens 184.

Figure 10:
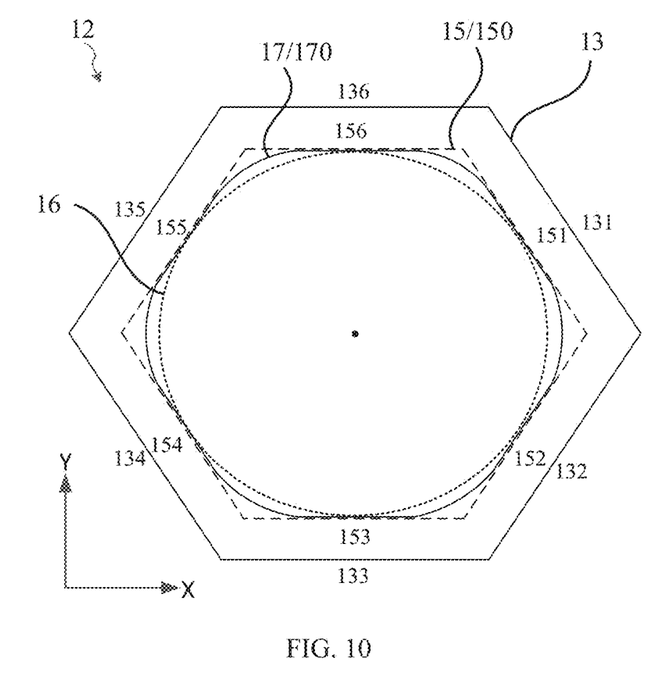
FIG. 10 is a top view of another sub-pixel according to an embodiment of the present disclosure.
Figure 11:
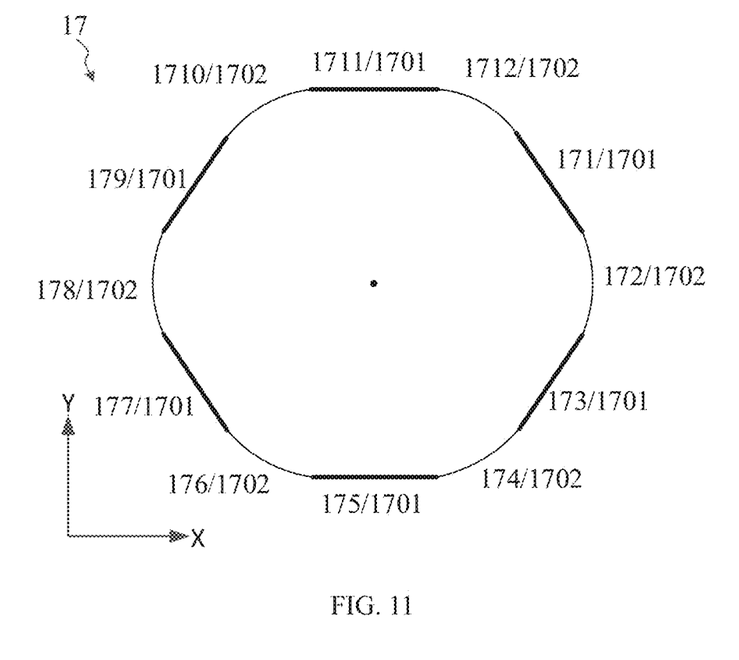
FIG. 11 is a top view of pixel openings in FIG. 10.

FIG. 10 is a top view of another sub-pixel according to an embodiment of the present disclosure. FIG. 11 is a top view of pixel openings in FIG. 10. For clarity, opening sides of a first type 1701 are shown in bold. Referring to FIG. 10 and FIG. 11, a virtual polygon 15 includes n virtual sides 150. A pixel opening 17 includes 2n opening sides 170. The 2n opening sides 170 include n opening sides of a first type 1701 and n opening sides of a second type 1702. An opening side of the first type 1701 is connected to two opening sides of the second type 1702. An opening side of the second type 1702 is connected to two opening sides of the first type 1701. The opening sides of a first type 1701 and the opening sides of a second type 1702 are arranged one by one at intervals. The n opening sides of a first type 1701 are parallel to the n virtual sides 150 in a one-to-one manner. The opening sides of a second type 1702 are curves convex toward the direction facing away from the center of the sub-pixel. In this embodiment of the present disclosure, each opening side of the second type 1702 is a curve convex toward the virtual polygon 15, thereby increasing the area of the pixel opening 17 and increasing the aperture ratio.

Exemplarily, with reference to FIG. 10 and FIG. 11, n=6 is used as an example. The virtual polygon 15 includes 6 virtual sides 150. The 6 virtual sides 150 are a first virtual side 151, a second virtual side 152, a third virtual side 153, a fourth virtual side 154, a fifth virtual side 155, and a sixth virtual side 156 connected in sequence. The pixel opening 17 includes 12 opening sides 170. The 12 opening sides 170 are a first opening side 171, a second opening side 172, a third opening side 173, a fourth opening side 174, a fifth opening side 175, a sixth opening side 176, a seventh opening side 177, an eighth opening side 178, a ninth opening side 179, a tenth opening side 1710, an eleventh opening side 1711, and a twelfth opening side 1712 connected in sequence. The first opening side 171, the third opening side 173, the fifth opening side 175, the seventh opening side 177, the ninth opening side 179, and the eleventh opening side 1711 are opening sides of the first type 1701. The second opening side 172, the fourth opening side 174, the sixth opening side 176, the eighth opening side 178, the tenth opening side 1710, and the twelfth opening side 1712 are opening sides of the second type 1702. The first opening side 171 is parallel to the first virtual side 151. The third opening side 173 is parallel to the second virtual side 152. The fifth opening side 175 is parallel to the third virtual side 153. The seventh opening side 177 is parallel to the fourth virtual side 154. The ninth opening side 179 is parallel to the fifth virtual side 155. The eleventh opening side 1711 is parallel to the sixth virtual side 156.

Exemplarily, with reference to FIG. 10, a first electrode side 131 is parallel to the first virtual side 151. A second electrode side 132 is parallel to the second virtual side 152. A third electrode side 133 is parallel to the third virtual side 153. A fourth electrode side 134 is parallel to the fourth virtual side 154. A fifth electrode side 135 is parallel to the fifth virtual side 155. A sixth electrode side 136 is parallel to the sixth virtual side 156.

Figure 12:
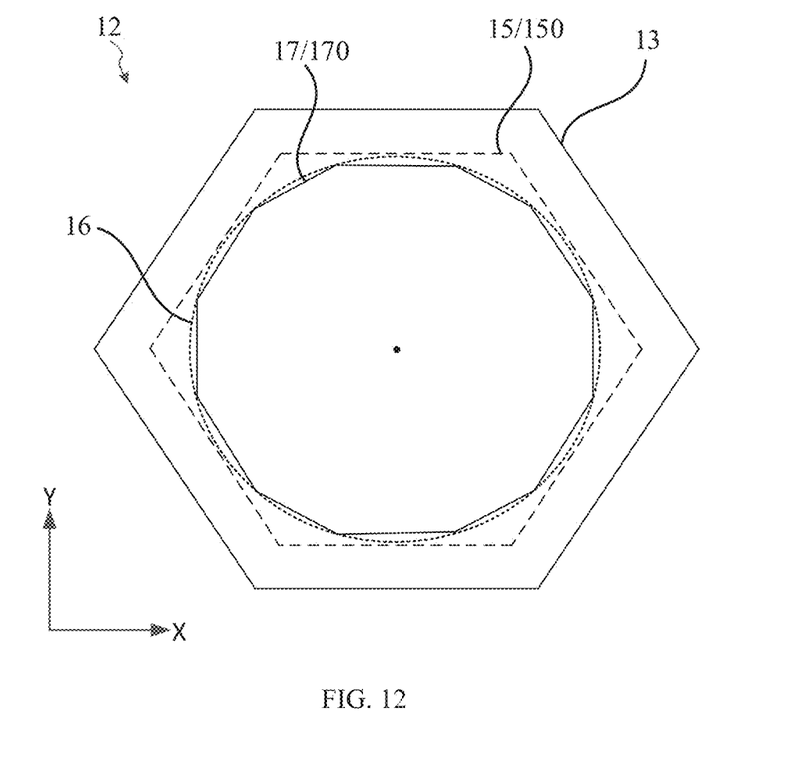
FIG. 12 is a top view of another sub-pixel according to an embodiment of the present disclosure.

FIG. 12 is a top view of another sub-pixel according to an embodiment of the present disclosure. With reference to FIG. 7 and FIG. 12, the vertical projection of a pixel opening 17 in the substrate 11 is located in a virtual ellipse 16. The pixel opening 17 includes multiple opening sides 170 connected in sequence. The number of opening sides 170 is greater than the number of virtual sides 150.

Optionally, with reference to FIG. 7, the display panel also includes a pixel defining layer 181. The pixel defining layer 181 is located on the side of the first electrode 13 facing away from the substrate 11 and is provided with multiple pixel openings 17. The sub-pixel 12 also includes a light-emitting function layer 182 and a second electrode 183. The light-emitting function layer 182 is located between the first electrode 13 and the second electrode 183. The light-emitting function layer 182 is located in a pixel opening 17. The second electrode 183 is located on the side of the light-emitting function layer 182 facing away from the substrate 11. The display panel provided in this embodiment of the present disclosure is an organic light-emitting display panel. In other embodiments, the display panel may be a display panel of another type such as a liquid crystal display panel.

Figure 13:
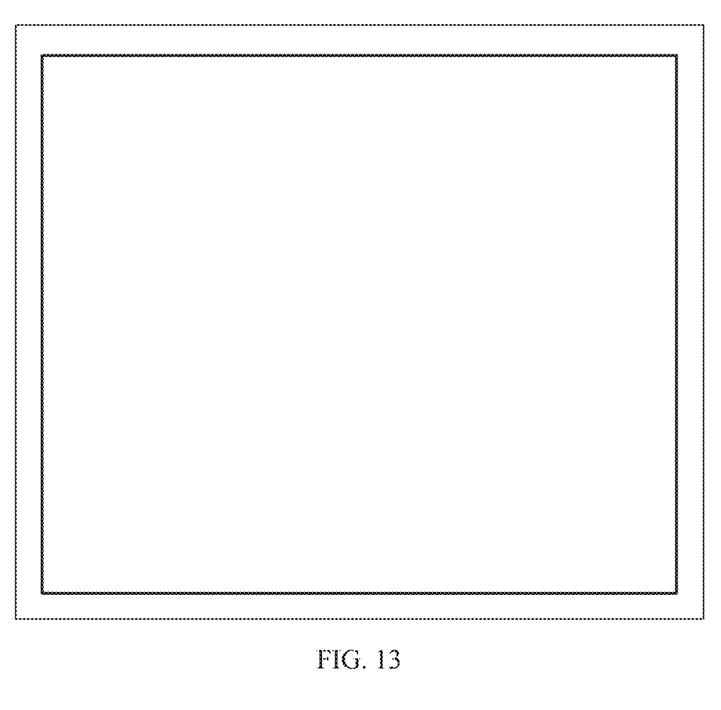
FIG. 13 is a top view of a display apparatus according to an embodiment of the present disclosure.

An embodiment of the present disclosure also provides a display apparatus. FIG. 13 is a top view of a display apparatus according to an embodiment of the present disclosure. Referring to FIG. 13, the display apparatus includes the display panel provided in any embodiment of the present disclosure. The display apparatus may be a mobile phone, a tablet PC, an intelligent wearable device, and so on.

It is to be noted that the preceding are only preferred embodiments of the present disclosure and technical principles used therein. It is to be understood by those skilled in the art that the present disclosure is not limited to the embodiments described herein. Those skilled in the art can make various apparent modifications, adaptations, combinations, and substitutions without departing from the scope of the present disclosure. Therefore, while the present disclosure has been described in detail through the preceding embodiments, the present disclosure is not limited to the preceding embodiments and may include more other equivalent embodiments without departing from the concept of the present disclosure. The scope of the present disclosure is determined by the scope of the appended claims.

What is claimed is:

1. A display panel, comprising a display region;
a substrate; and
a plurality of sub-pixels located in the display region on one side of the substrate, wherein the plurality of sub-pixels are arranged in rows along a first direction, two adjacent rows of sub-pixels of the plurality of sub-pixels are staggered, and the plurality of sub-pixels comprise first sub-pixels and second sub-pixels located in the two adjacent rows, wherein coordinates of a center of a first sub-pixel are denoted as (0, 0), and coordinates of a center of a second sub-pixel are denoted as $(x_1, y_1)$;
a sub-pixel of the plurality of sub-pixels comprises a first electrode, wherein in a direction perpendicular to the substrate, the first electrode is polygonal and comprises a first electrode side and a second electrode side connected in sequence, and an included angle between the first electrode side and the first direction and an included angle between the second electrode side and the first direction are each θ;
a length of a horizontal axis of a circumscribed ellipse of a polygonal edge of the first electrode along the first direction is denoted as a, a length of a vertical axis of the circumscribed ellipse along a second direction is denoted as b, and the second direction is perpendicular to the first direction; and
a circumscribed ellipse of the first sub-pixel is tangent to a circumscribed ellipse of the second sub-pixel,
wherein $$\theta \text{ satisfies } \theta = \arctan\left(\left|-\frac{b^2 x_1}{a^2 y_1}\right|\right).$$

2. The display panel according to claim 1, wherein the first electrode is hexagonal and further comprises a third electrode side, a fourth electrode side, a fifth electrode side, and a sixth electrode side connected in sequence, wherein the third electrode side is connected to the second electrode side and the fourth electrode side, and the sixth electrode side is connected to the fifth electrode side and the first electrode side; and
the third electrode side and the sixth electrode side extend along the first direction, the first electrode side is parallel to the fourth electrode side, and the second electrode side is parallel to the fifth electrode side.

3. The display panel according to claim 1, wherein a width of the display region along the first direction is denoted as w, and a height of the display region along the second direction is denoted as h,
wherein in a case where $$a > b, \frac{1.5\, w}{h} > \frac{a}{b} > \frac{0.5\, w}{h};$$

and
in a case where $$a < b, \frac{1.5\, h}{w} > \frac{b}{a} > \frac{0.5\, h}{w}.$$

4. The display panel according to claim 1, wherein the polygon formed by the first electrode comprises a virtual polygon, and each virtual side of the virtual polygon is parallel to each electrode side of the polygon formed by the first electrode in a one-to-one manner;
a length of a horizontal axis of a virtual ellipse in the polygon formed by the first electrode along the first direction is denoted as a·j, and a length of a vertical axis of the virtual ellipse along the second direction is denoted as b·j, wherein 0<j<1;
the virtual ellipse is located in the virtual polygon and tangent to a plurality of virtual sides; and
the display panel further comprises a pixel opening, and a vertical projection of the pixel opening in the substrate is located in the virtual polygon.

5. The display panel according to claim 4, wherein the pixel opening coincides with the virtual polygon.

6. The display panel according to claim 4, further comprising a microlens, wherein the microlens is located on a side of the sub-pixel facing away from the substrate, and
perpendicular to the direction of the substrate, the microlens overlaps the virtual ellipse.

7. The display panel according to claim 6, wherein the pixel opening coincides with the virtual ellipse.

8. The display panel according to claim 6, wherein the virtual ellipse is located in the vertical projection of the pixel opening in the substrate, and the vertical projection of the pixel opening in the substrate is located in the virtual polygon.

9. The display panel according to claim 8, wherein the pixel opening comprises a plurality of opening sides connected in sequence, and a number of the plurality of opening sides is greater than a number of the plurality of virtual sides.

10. The display panel according to claim 9, wherein the virtual polygon comprises n virtual sides;
the pixel opening comprises 2n opening sides, and the 2n opening sides comprise n opening sides of a first type and n opening sides of a second type, wherein one of the n opening sides of the first type is connected to two of the n opening sides of a second type;
the n opening sides of the first type are parallel to the n virtual sides in a one-to-one manner; and
the n opening sides of the second type are curves convex toward a direction facing away from a center of the sub-pixel.

11. The display panel according to claim 6, wherein the vertical projection of the pixel opening in the substrate is located in the virtual ellipse; and
the pixel opening comprises a plurality of opening sides connected in sequence, and a number of the plurality of opening sides is greater than a number of the plurality of virtual sides.

12. The display panel according to claim 4, further comprising a pixel defining layer, wherein the pixel defining layer is located on a side of the first electrode facing away from the substrate and is provided with a plurality of pixel openings; and
each of the plurality of sub-pixels further comprises a light-emitting function layer and a second electrode, wherein the light-emitting function layer is located between the first electrode and the second electrode and in a pixel opening of the plurality of pixel openings, and the second electrode is located on a side of the light-emitting function layer facing away from the substrate.

13. A display apparatus, comprising a display panel, wherein the display panel comprises:
a display region;
a substrate; and
a plurality of sub-pixels located in the display region on one side of the substrate, wherein the plurality of sub-pixels are arranged in rows along a first direction, two adjacent rows of sub-pixels of the plurality of sub-pixels are staggered, and the plurality of sub-pixels comprise first sub-pixels and second sub-pixels located in the two adjacent rows, wherein coordinates of a center of a first sub-pixel are denoted as (0, 0), and coordinates of a center of a second sub-pixel are denoted as $(x_1, y_1)$;
a sub-pixel of the plurality of sub-pixels comprises a first electrode, wherein in a direction perpendicular to the substrate, the first electrode is polygonal and comprises a first electrode side and a second electrode side connected in sequence, and an included angle between the first electrode side and the first direction and an included angle between the second electrode side and the first direction are each θ;
a length of a horizontal axis of a circumscribed ellipse of a polygonal edge of the first electrode along the first direction is denoted as a, a length of a vertical axis of the circumscribed ellipse along a second direction is denoted as b, and the second direction is perpendicular to the first direction; and
a circumscribed ellipse of the first sub-pixel is tangent to a circumscribed ellipse of the second sub-pixel,
wherein $$\theta \text{ satisfies } \theta = \arctan\left(\left|-\frac{b^2 x_1}{a^2 y_1}\right|\right).$$

14. The display apparatus according to claim 13, wherein the first electrode is hexagonal and further comprises a third electrode side, a fourth electrode side, a fifth electrode side, and a sixth electrode side connected in sequence, wherein the third electrode side is connected to the second electrode side and the fourth electrode side, and the sixth electrode side is connected to the fifth electrode side and the first electrode side; and
the third electrode side and the sixth electrode side extend along the first direction, the first electrode side is parallel to the fourth electrode side, and the second electrode side is parallel to the fifth electrode side.

15. The display apparatus according to claim 13, wherein a width of the display region along the first direction is denoted as w, and a height of the display region along the second direction is denoted as h,
wherein in a case where $$a > b, \frac{1.5\,w}{h} > \frac{a}{b} > \frac{0.5\,w}{h};$$

and
in a case where $$a < b, \frac{1.5\,h}{w} > \frac{b}{a} > \frac{0.5\,h}{w}.$$

16. The display apparatus according to claim 13, wherein the polygon formed by the first electrode comprises a virtual polygon, and each virtual side of the virtual polygon is parallel to each electrode side of the polygon formed by the first electrode in a one-to-one manner;
a length of a horizontal axis of a virtual ellipse in the polygon formed by the first electrode along the first direction is denoted as a·j, and a length of a vertical axis of the virtual ellipse along the second direction is denoted as b·j, wherein 0<j<1;

the virtual ellipse is located in the virtual polygon and tangent to a plurality of virtual sides; and the display panel further comprises a pixel opening, and a vertical projection of the pixel opening in the substrate is located in the virtual polygon.

17. The display apparatus according to claim 16, wherein the pixel opening coincides with the virtual polygon.

18. The display apparatus according to claim 16, wherein the display panel further comprises a microlens, wherein the microlens is located on a side of the sub-pixel facing away from the substrate, and perpendicular to the direction of the substrate, the microlens overlaps the virtual ellipse.

19. The display apparatus according to claim 18, wherein the pixel opening coincides with the virtual ellipse.

20. The display apparatus according to claim 18, wherein the virtual ellipse is located in the vertical projection of the pixel opening in the substrate, and the vertical projection of the pixel opening in the substrate is located in the virtual polygon.

\* \* \* \* \*